United States Patent [19]

Baudry et al.

[11] Patent Number: 4,636,257

[45] Date of Patent: Jan. 13, 1987

[54] SILK SCREEN PRINTING PASTE WITH LEAD GLASS WHICH IS TO BE FIRED IN A NON-OXIDIZING ATMOSPHERE

[75] Inventors: Hugues Baudry, Varennes-Jarcy; Marc A. Monneraye, Saint-Maur-des-Fosses; Claude Morhaim, Paris, all of France

[73] Assignee: U.S. Philips Corporation, New York, N.Y.

[21] Appl. No.: 388,385

[22] Filed: Jun. 14, 1982

[30] Foreign Application Priority Data

Jun. 19, 1981 [FR] France ............................. 81 12123

[51] Int. Cl.⁴ .......................................... C09D 11/00
[52] U.S. Cl. ..................................... 106/19; 101/114; 252/518; 252/521; 501/62
[58] Field of Search ................. 106/19; 252/521, 518; 501/62; 101/114

[56] References Cited

U.S. PATENT DOCUMENTS 4,225,469 9/1980 Horowitz et al. ............... 252/518
4,302,362 11/1981 Hoffman et al. ................ 252/518

FOREIGN PATENT DOCUMENTS 6078447 11/1979 Japan .
6160340 5/1980 Japan .
7038342 8/1980 Japan .
7095848 12/1980 Japan .
734154 7/1978 U.S.S.R. .
804583 8/1978 U.S.S.R. .

Primary Examiner—Amelia B. Yarbrough
Attorney, Agent, or Firm—Norman N. Spain

[57] ABSTRACT

The invention relates to a silk screen printing paste which is provided according to the thick-layer technique and is to be fired in a non-oxidizing atmosphere and which comprises a mixture of a vitreous passive component and a permanent binder, an active component and a temporary binder, characterized in that it also comprises one or more lead oxide(s) having a degree of oxidation higher than 2 in a quantity below 20% by volume.

The invention also relates to hybrid circuits manufactured by means of said paste.

Application: hybrid micro-circuits.

5 Claims, 1 Drawing Figure

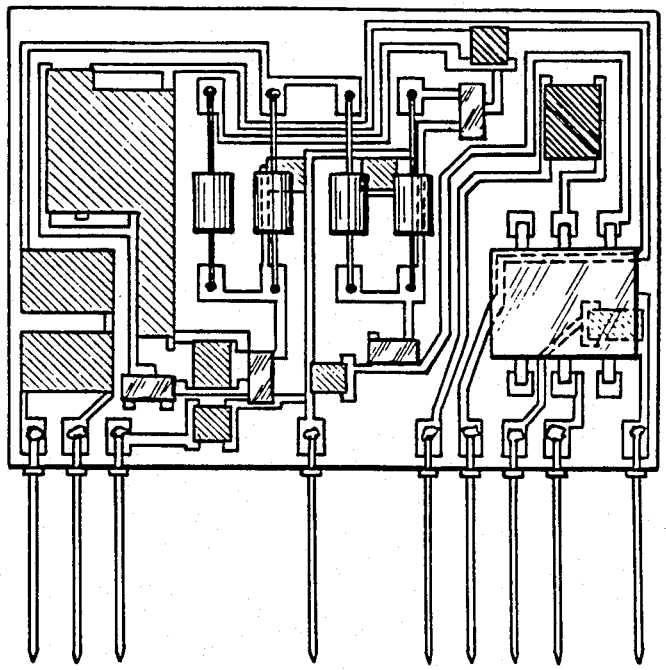

SILK SCREEN PRINTING PASTE WITH LEAD GLASS WHICH IS TO BE FIRED IN A NON-OXIDIZING ATMOSPHERE

BACKGROUND OF THE INVENTION

The invention relates to a silk screen printing paste which is provided according to the thick-layer technique and is to be fired in a non-oxidizing atmosphere and which comprises a mixture of a vitreous passive component as a permanent binder, an active component and a temporary organic binder. The invention also relates to hybrid circuits manufactured by means of said paste.

The invention is used in the field of micro-electronics, more in particular in the manufacture of hybrid microcircuits for which a whole series of silk screen printing pastes is to be formulated which are adapted to the various carriers used.

Such silk screen printing pastes are known, for example, from British Patent Specification 1,489,031 which discloses a conductive silk screen printing paste comprising copper which paste is provided on a carrier of sintered aluminum oxide and which is curable in a non-oxidizing atmosphere, i.e. an atmosphere having an oxygen content below 0.001%.

When such sintered aluminum oxide carrier is used, it is possible to formulate a whole series of suitable pastes which are to be fired in a non-oxidizing atmosphere at temperature of approximately 850° C.

The recent marketing of certain new carriers, for example, the black enameled sheet steel of Messrs. ALPHAMETALS necessarily forces manufacturers to formulate new series of suitable pastes which are curable at lower temperatures, approximately 550° C., so as not to spoil the enamel of the carrier.

Black enameled sheet steel consists of an extra-low carbon steel core, coated with an enamel layer consisting of filled glass: the glass containing essentially various transition metal oxides, such as Co, Mn, Ni . . . and the filler being, for example, $SiO_2$, $ZrO_2$, $ZrSiO_4$ . . .

The enamel is applied as frit slurry, then dried and fired to form the coating.

Such a substrate offers several unique features of interest to hybrid manufacturers. Enameled steel is strong and easy to form, and may serve either as a carrier of circuitry or as a structural component or chassis. Special shapes and holes in the steel may be formed prior to enameling. The steel core is an excellent heat sink, and may serve as an electrical plane, usually as the ground, or sometimes as a power distribution plane.

Lead oxide-containing glasses have a low melting-point, but they suffer from the disadvantage that upon firing in a neutral atmosphere—for example in nitrogen—at a temperature above 450° C. they decompose by reduction of the lead oxide by the active component.

Moreover, the organic binder of the silk screen printing paste fails to disappear fully from the silk screened layer, in particular when a neutral firing atmosphere is used, and causes the formation of residues which spoil the properties of such layers and contribute to the decomposition of the glass.

Further order to prevent the decomposition of the glass a composition is chosen which contains no reducing oxides at the firing temperatures in question. However, such a composition has a higher melting-temperature, in the order of 900° C., which requires use of carriers of sintered aluminium oxide which can withstand said firing temperatures.

In order to better eliminate the organic carrier, Applicants have considered to introduce metal oxides of a valency of more than 1 in the silk screen printing paste the valency which metal oxides, during firing, are reduced to monovalent and which are dispersed in small quantities in the organic carrier, for example, the oxides of praseodymium ($Pr_6O_{11}$, $PrO_2$), cerium ($CeO_2$) or cobalt ($Co_3O_4$), when said oxides are reduced to a lower degree of valency they, change into the vitreous phase without adversely influencing the properties of the silk screened layer. This improvement is disclosed in British Patent Specification 2,037,270.

The glass used in the this British Patent Specification is within the following composition range in mol.%:

$SiO_2$: 5–20%
$B_2O_3$: 15–40%
$Al_2O_3$: 0–5%
ZnO: 25–40%
CaO+MgO: 5–30%
$Li_2O$: 0–10%.

This glass comprises no lead oxide (PbO) and has a comparatively high annealing point of 575° C.

U.S. Pat. No. 3,647,532 discloses a copper-containing conductive silk screen printing paste, the glass of which comprises lead oxide; this necessitates firing in a weakly oxidizing atmosphere with a partial oxygen pressure between $10^{-1}$ and $10^{-4}$ at. so as to void decomposition of the glass. Continuous and accurate control of the gas atmosphere introduced in the firing furnace of the silk screen printed patterns is required. After firing in such an atmosphere the glass moreover shows a poor bonding.

SUMMARY OF THE INVENTION

It is the object of the invention to make this accurate control superfluous while allowing the use of such new substrate materials such as enameled sheet iron which require the use of silk screen printing pastes having a firing temperature of under 600° C.

When a carrier of enameled sheet steel is used, a different solution is necessary to the problem of decomposition of the lead glass and the removal of the organic residues. According to the invention, an oxidation agent is incorporated in the silk screen printing paste which is reduced during the firing phase and liberates a sufficient quantity of oxygen to prevent the reduction of the lead oxide (PbO) in the glass and to burn the carbon residue.

In particular, the silk screen printing paste of the invention is characterized in that it also comprises one or more lead oxide(s) having a degree of oxidation which is higher than 2, in a total quantity below 20% by volume.

By use of such a lead oxide the paste is provided with an oxidation agent which is reducible from a temperature of 410° C. and with which the decomposition of the glass can be prevented and in which the annealing point of the glass can be reduced because, once this higher valent lead oxide is reduced to the PbO, it increases the content of the glass of (PbO) and hence reduces the softening temperature thereof.

According to a preferred embodiment of the invention the lead oxide chosen is lead dioxide $PbO_2$ in a quantity between 5 and 15% by volume.

Lead is chosen from all dioxides which lead oxides of which the degree of oxidation is larger than 2 functioning as the oxidation agent referred to above, for example $Pb_2O_3$, $Pb_3O_4$, ..., $PbO_2$, as this oxide has for its advantage that it is reduced in a temperature range between 410° and 625° C. and liberates a comparatively larger quantity of oxygen.

According to an embodiment of the invention the silk screen printing paste is characterized in that the vitreous so-called passive part is a low melting-point lead glass frit which is obtained by melting and grinding the following mixture of oxides in mol.%

PbO: 40-60%
$SiO_2$: 25-45%
$Al_2O_3$: 5-15%
$B_2O_3$: 0-10%.

This lead glass frit preferably has the following composition in mol.%

PbO: 57%
$SiO_2$: 33%
$Al_2O_3$: 10%.

In this composition the annealing point of the glass is approximately 440° C., and hence this glass may be used for formulating a silk screen printing paste which is provided on a substrate of enameled sheet iron.

A starting mixture which is destined to be dispersed in a usual organic binder, for example a solution of a resin in a solvent, with a suitable viscosity and a suitable rheological behaviour, for example ethylcellulose in terpineol, generally comprises at least two parts in powder form: a vitreous so-called passive part the function of which mainly is to bond the assembly of the silk screen printed layer to the substrate, and a so-called active part the essential function of which is of an electric nature.

The silk screen printing paste which is composed by means of this starting mixture, during printing must pass through a sieve or gauze the dimensions of which are finer according to a better definition of the reproduced pattern is to be obtained. The usual gauzes have 325 meshes per linear inch, which represents a calculated mesh in microns in the order of 50 μm. A good rule is to use particles the dimensions of which are at least five times smaller. So the powders used have a maximum dimension in the order of 10 μm, a substantially spherical shape or at least a round shape and are perfectly compact (dense, with a non-porous surface). They are obtained by grinding in a ball mill for some ten hours.

The active parts of the silk screen printing paste is selected on the basis of the desired electrical properties. For the manufacture of a conductive paste this part may be, for example, gold or silver and in that case the paste will be fired in air. This part may consist of an alloy, for example, Au Pd, Ag Pd, Au Pt and preferably Au Pt Pd, which alloy is formed during firing while the starting mixture comprises the composing metals in powder form. Copper may also be used but requires a firing treatment in a non-oxidizing atmosphere with a partial oxygen pressure between 5 and $10 \times 10^{-4}$%.

DESCRIPTION OF THE PREFERRED EMBODIMENT

The invention will now be described in greater detail with reference to an example.

First of all a glass frit of the following starting composition in mol.% is prepared:
PbO: 57%
$SiO_2$: 33%
$Al_2O_3$: 10%.

This mixture is melted at a temperature of approximately 1200° C., then ground in a ball mill for 64 hours until the grains have a maximum dimension in the order of 10 microns.

For the preparation of a starting mixture for an insulating silk screen printing paste, for example, a ceramic filler must be added in powder form, for example, magnesium oxide (MgO), lanthanum oxide ($La_2O_3$) or lanthanum aluminate ($LaAlO_3$). The latter is chosen more in particular due to the coefficient of linear expansion which is adapted to the carrier of enameled sheet steel with a value $$\alpha = 95 \times 10^{-7} °C.^{-1} (20°-700° C.).$$

Lanthanum aluminate is prepared by mixing commercially available powdered aluminum oxide ($Al_2O_3$) and lanthanum oxide ($La_2O_3$) in a ball mill and heating the mixture first at 1200° C. for 4 hours and then at 1600° C. for fifteen hours. The final product is ground for a few hours in the ball mill in water so as to obtain a suitable grain composition.

The glass frit as described above and the ceramic filler are then mixed. A good compact insulation means is obtained when the volume ratio of glass to ceramic filler exceeds 1 in the above-mentioned starting mixture, for example 3/1.

Among the various tested ceramic fillers lanthanum aluminate is best compatible with the glass described (PbO=57%, $Al_2O_3$: 10%, $SiO_2$: 33%), which glass otherwise is one of the most viscous in the range of compositions suggested because it comprises no boron oxide.

But even while such starting mixtures and silk screen printing pastes containing such mixtures can be fired in air and are hence compatible with conductive pastes Ag-Pd (85-15), they decompose and carbonise by firing in a neutral atmosphere and are hence not compatible with copper conductive pastes.

The efficacity of the addition of the higher oxidation lead oxides within the scope of the invention has been demonstrated by preparing pastes with increasing contents of these lead oxides and by using them for silk screening and firing them at a temperature of 600° C. The gradual passage of the black tint, which indicates the formation of metallic lead, to an orange-like tint ($Pb_3O_4$) clearly demonstrates the advantage of this addition. Various contents up to 20% have been investigated for the various lead oxides as a result of which it was found that for $PbO_2$ the best results were formed at a content of 5-15% by volume, for example at approximately 10% by volume.

Lead oxide, when added to the starting mixture, may be incorporated in the vitreous phase after reduction so that the softening temperature of the glass is reduced and the flowing over the ceramic material is promoted.

The lead oxide may also remain in the ceramic phase when it is incorporated insufficiently by the glass.

Experience has proved that the best volume ratio between the various composing parts of the starting mixture for the silk screen printing paste is as follows:
glass (PbO/$SiO_2$/$Al_2O_3$): 85%
La Al $O_3$: 3%
$PbO_2$: 12%.

The silk screen printing paste which is obtained by means of said starting mixture is excellently compatible with the silk screen printing paste employed for conductors, in particular the copper paste.

Such a copper paste may have the following composition:

| organic vehicle | ethyl cellulose in terpineol | | |
|---|---|---|---|
| active component | spherical copper powder | | |
| passive component | glass PbO 57% | } | molar percentage |
| | SiO$_2$ 23% | | |
| | B$_2$O$_3$ 20% | | |
| active 95% | (volumic percentage) | | |
| passive 5% | (less than 15%) | | |

The organic vehicle is more than 55% (in volumic percentage) f.i.
  60% vehicle
  40% component Moreover, because firing of such an assembly can be carried out at temperatures of approximately 550° C., such a silk screen printing paste is excellently suitable for use on a substrate of enameled sheet steel and can be provided in combination with other silk screen printed layers which can be provided in a non-oxidising atmosphere at low temperatures in a single layer or in a multi-layer pattern with conductive (copper paste) or insulating (lanthanum aluminate paste) parts in, for example, hybrid circuits.

The substrate may consist of enameled sheet steel which is used especially by Messrs. ALPHAMETALS, or with white enamel which is made opaque with titanium oxide, which is used in particular by the designers of household applicances, for example C.E.M.A., and which are also suitable as supports for providing silk screen printing pastes.

This white enamel is provided with a piece of decarbonised sheet steel which is covered first of all with a thin layer of nickel powder in a quantity of 1 g/m$^2$, after slightly etching the sheet steel, for example by means of sulphuric acid until a decrease in weight of 20 to 30 g/m$^2$. An example of a mixture of a white enamel with titanium dioxide made opaque is the following in % by weight:
  zinc oxide: 1.70
  boric acid: 4.70
  anhydrous borax: 19.00
  sodium fluosilicate: 6.00
  quartz: 33.80
  potassium carbonate: 6.20
  potassium nitrate: 5.60
  mono-ammonium phosphate: 4.30
  titanium dioxide: 18.70.

This enamel composition is applied to the nickel covered iron, described above), to form the said white enameled sheet iron.

The development of sensors for electrical houshold appliances such as washing machines, refrigerators, and so on, has lead the Applicants to manufacture silk screen printing patterns on said enameled carriers in accordance with the present invention and the results obtained have proved to be excellent both as regards the mechanical properties such as the tensile strength, the weldability, and so on, and as regards the electrical properties of the layers thus formed.

Thick film is a predominant technique for printing conductor and resistor networks, on a hybrid substrate. The basic materials employed are high viscosity pseudoplastic pastes containing metal powders and vitreous binders suspended in an organic vehicle. The process consists of applying these pastes to a substrate by screen printing, then firing to bond the film to the substrate.

Production sequence for a typical thick film consists of
  (a) starting with free substrate (f.i. 1$\frac{3}{4}$ in $\times$ 9/16 in)
  (b) screen printing conductors and dielectric multilayers
  (c) forming on selected areas, a glass coating for short circuit protection;
  (d) firing in nitrogen atmosphere, at 550° C., during ten minutes;
  (e) completing the substrate with discrete components (transistors, resistors . . . ).

The drawing represents a hybrid circuit on enameled sheet steel used as a switching circuit for a three colour traffic light. The circuit comprises thick film elements, deposited on the substrate by silk screen printing conductors obtained by a copper ink and resistors, simple active components, such as diodes and transistors and complex active components, such as a photocoupler.

The substrate, after printing, must be fired in a nitrogen atmosphere, specially with copper conducting paste, with less than 10 ppm of O$_2$ in a range of temperatures comprised between 500° and 650° C., preferably at 550° C. The cycle of firing does not exceed one hour, with ten minutes at 550° C.

Of course those skilled in the art can imagine, without inventive effort, numerous non-essentially different variations, without departing from the scope of the present invention.

What is claimed is:

1. In a silk screen printing paste for use in a thick-film technique which paste is fired in a non-oxidizing atmosphere and which paste comprises a mixture of a passive vitreous component as a permanent binder, an active component and a temporary organic binder, the improvement wherein said paste also comprises one or more lead oxide(s) having a degree of oxidation higher than 2 in a total quantity below 20% by volume.

2. A silk screen printing paste as claimed in claim 1, characterized in that lead dioxide (PbO$_2$) in a quantity between 5 and 15% by volume is chosen as a lead oxide.

3. A silk screen printing paste as claimed in claim 1 or claim 2, characterized in that the passive vitreous component is a lead glass frit having a low melting-point which is obtained by grinding and melting the following oxide mixture in mol.%:
  PbO: 40–60
  SiO$_2$: 25–45
  Al$_2$O$_3$: 5–15
  B$_2$O$_3$: 0–10.

4. A silk screen printing paste as claimed in claim 3, characterized in that the passive vitreous component is a frit of the following glass in mol.%: PbO 57%, SiO$_2$ 33% and Al$_2$O$_3$ 10%.

5. A silk screen printing paste as claimed in claim 1, for obtaining insulating circuit parts, characterized in that the active component is a ceramic material on the basis of lanthanum aluminate (LaAlO$_3$) which is present in a quantity between 1 and 10% by volume.

* * * * *